(12) United States Patent
Lee

(10) Patent No.: US 9,799,788 B2
(45) Date of Patent: Oct. 24, 2017

(54) SOLAR BATTERY AND METHOD FOR MANUFACTURING THE SAME

(75) Inventor: Dong Keun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 787 days.

(21) Appl. No.: 13/266,606

(22) PCT Filed: Jun. 30, 2010

(86) PCT No.: PCT/KR2010/004256
§ 371 (c)(1),
(2), (4) Date: Oct. 27, 2011

(87) PCT Pub. No.: WO2011/002230
PCT Pub. Date: Jan. 6, 2011

(65) Prior Publication Data
US 2012/0266950 A1    Oct. 25, 2012

(30) Foreign Application Priority Data

Jun. 30, 2009 (KR) ........................ 10-2009-0058788

(51) Int. Cl.
| H01L 31/0236 | (2006.01) |
| H01L 31/0232 | (2014.01) |
| H01L 31/0463 | (2014.01) |
| H01L 31/048 | (2014.01) |
| H01L 31/056 | (2014.01) |
| H01L 31/054 | (2014.01) |

(52) U.S. Cl.
CPC .......... *H01L 31/056* (2014.12); *H01L 31/048* (2013.01); *H01L 31/0488* (2013.01); *H01L 31/0543* (2014.12); *H01L 31/0547* (2014.12); *Y02E 10/52* (2013.01)

(58) Field of Classification Search
CPC ................................................ H01L 31/02366
See application file for complete search history.

(56) References Cited

U.S. PATENT DOCUMENTS

| 4,711,972 A | 12/1987 | O'Neill | |
| 6,335,479 B1 * | 1/2002 | Yamada et al. | 136/251 |
| 6,406,636 B1 * | 6/2002 | Vaganov | B23K 1/0016 |
| | | | 216/2 |
| 2002/0179139 A1 | 12/2002 | Hashimoto et al. | |
| 2006/0137733 A1 * | 6/2006 | Schripsema et al. | 136/246 |
| 2006/0196535 A1 | 9/2006 | Swanson et al. | |

(Continued)

FOREIGN PATENT DOCUMENTS

| EP | 1184912 A1 | 3/2002 |
| EP | 2043163 A2 | 4/2009 |

(Continued)

OTHER PUBLICATIONS

Office Action dated Jan. 28, 2014 in Japanese Application No. 2012-517411.

(Continued)

*Primary Examiner* — Magali P Slawski
(74) *Attorney, Agent, or Firm* — Saliwanchik, Lloyd & Eisenshenk

(57) ABSTRACT

A solar battery includes a polymer resin layer on a solar cell and an upper substrate on the polymer resin layer. A pattern is formed in the polymer resin layer.

8 Claims, 5 Drawing Sheets

(56) References Cited

U.S. PATENT DOCUMENTS

| | | | |
|---|---|---|---|
| 2007/0240754 A1* | 10/2007 | Gayout et al. | 136/246 |
| 2009/0050203 A1* | 2/2009 | Miyasaka et al. | 136/261 |
| 2009/0078250 A1 | 3/2009 | Ishii | |
| 2010/0089445 A1* | 4/2010 | Yasukawa | B32B 7/12 |
| | | | 136/256 |
| 2010/0147384 A1* | 6/2010 | Lerchenberger | B08B 7/0042 |
| | | | 136/261 |
| 2010/0326522 A1* | 12/2010 | Okaniwa | H01L 31/02168 |
| | | | 136/259 |
| 2011/0061717 A1 | 3/2011 | Kwon et al. | |

FOREIGN PATENT DOCUMENTS

| | | |
|---|---|---|
| JP | 58193646 U | 12/1983 |
| JP | 59-213177 | 12/1984 |
| JP | 60-128678 | 7/1985 |
| JP | 61-241982 | 10/1986 |
| JP | S63102279 A | 5/1988 |
| JP | S63248182 A | 10/1988 |
| JP | 6-45628 | 2/1994 |
| JP | 2001-127331 A | 5/2001 |
| JP | 2002-185027 A | 6/2002 |
| JP | 2002373995 A | 12/2002 |
| JP | 2009-088175 A | 4/2009 |
| JP | 2009-088503 A | 4/2009 |
| KR | 10-2009-0005324 A | 1/2009 |
| KR | 10-2009-0040200 A | 4/2009 |
| WO | WO-2009-005083 | 1/2009 |
| WO | WO-2009-063822 | 5/2009 |

OTHER PUBLICATIONS

Supplementary European Search Report dated Sep. 12, 2013 in European Application No. 10794365.6, filed Jun. 30, 2010.
Office Action dated Jun. 3, 2011 in Korean Application No. 10-2009-0058788, filed Jun. 30, 2009.
International Search Report in International Application No. PCT/KR2010/004256, dated Jun. 30, 2010.
Office Action dated Oct. 13, 2015 in Japanese Application No. 2014-25239.
Office Action dated Apr. 5, 2016 in Japanese Application No. 2012-517411.
Office Action dated Aug. 23, 2016 in Japanese Application No. 2012517411.

* cited by examiner

【Figure 1】
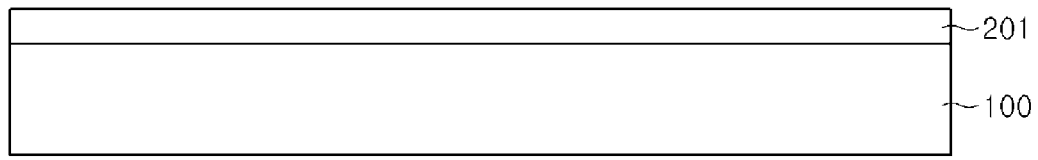
【Figure 2】
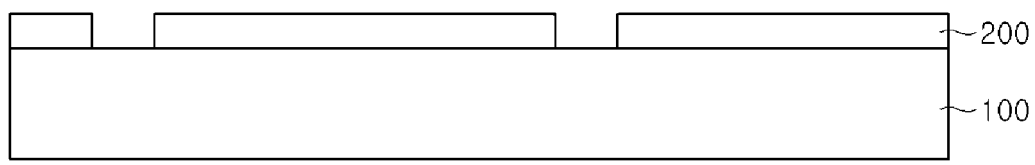
【Figure 3】
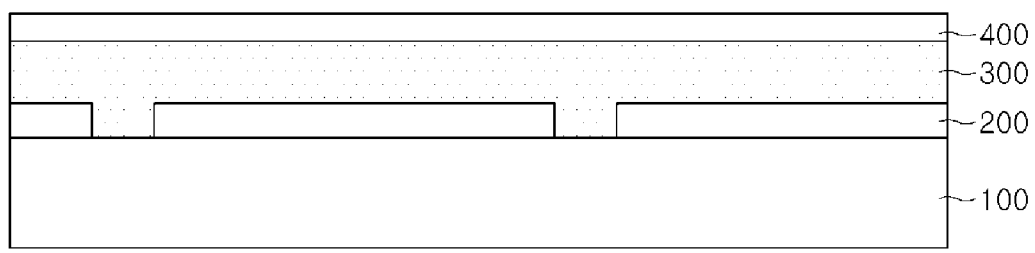
【Figure 4】
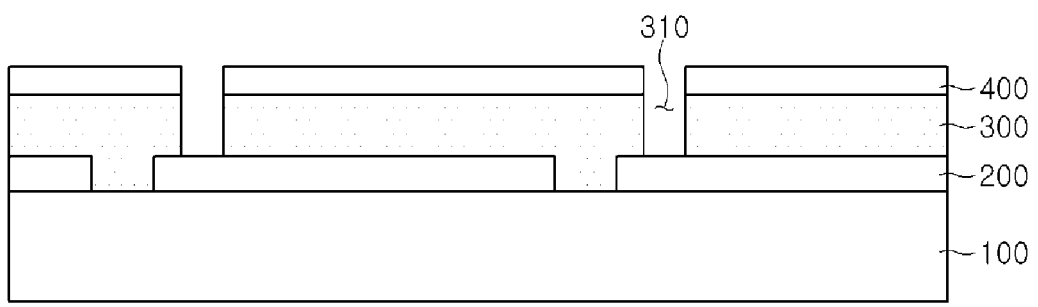

[Figure 5]
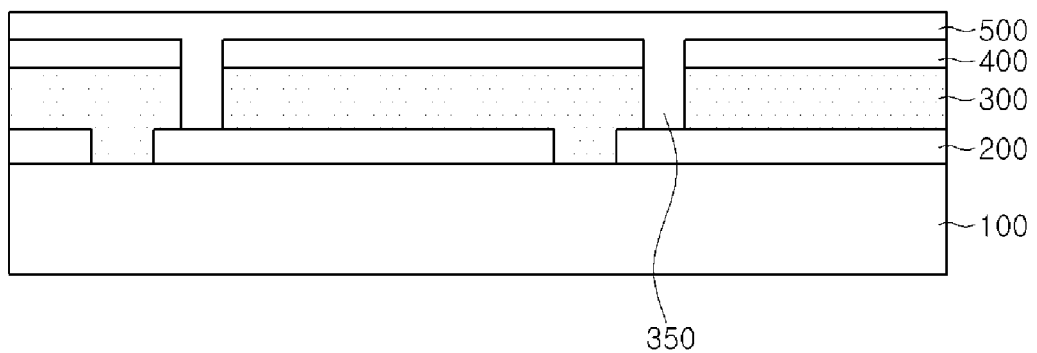
[Figure 6]
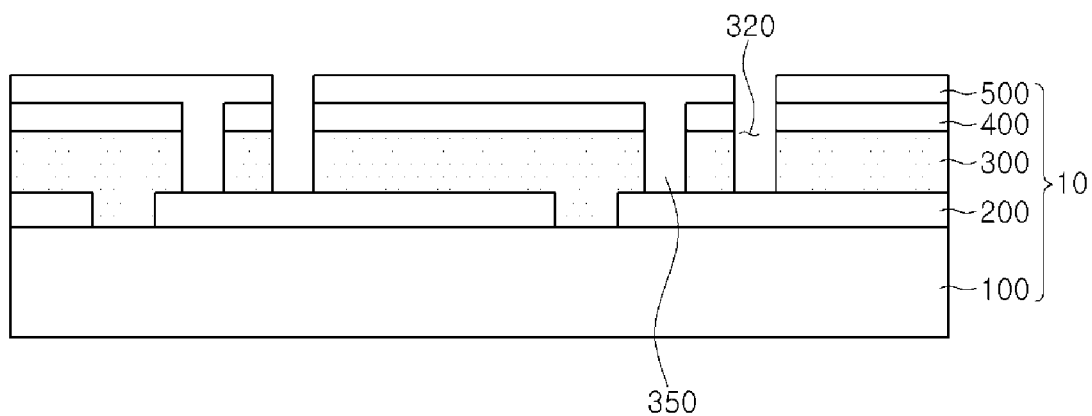

【Figure 7】
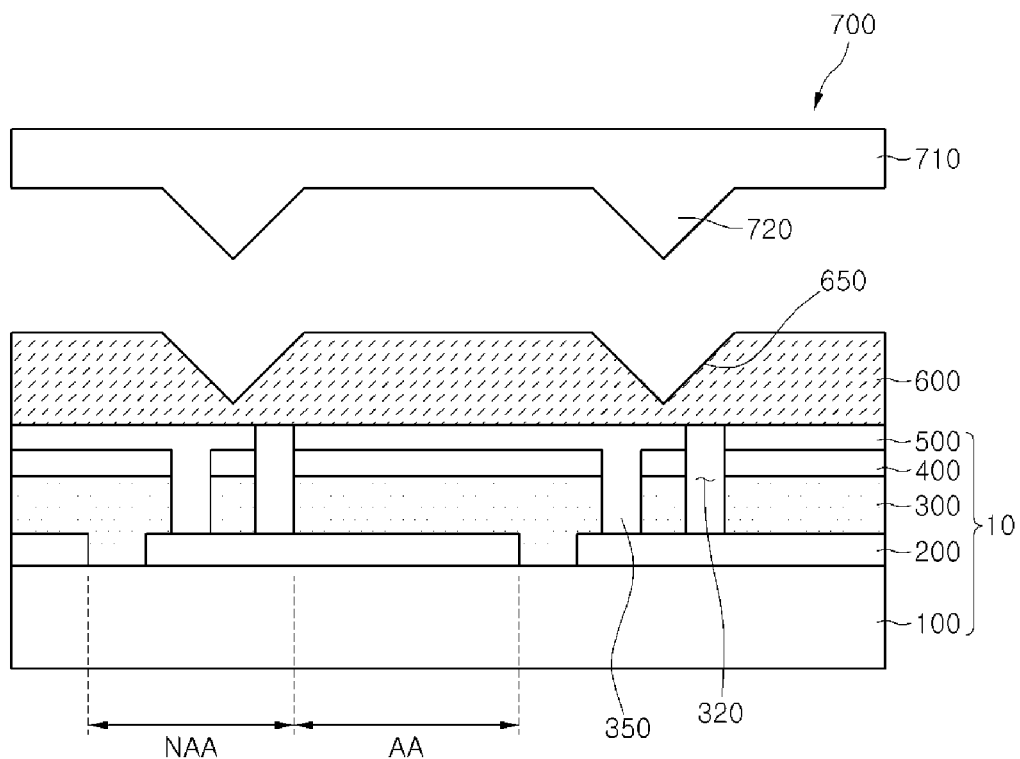
【Figure 8】
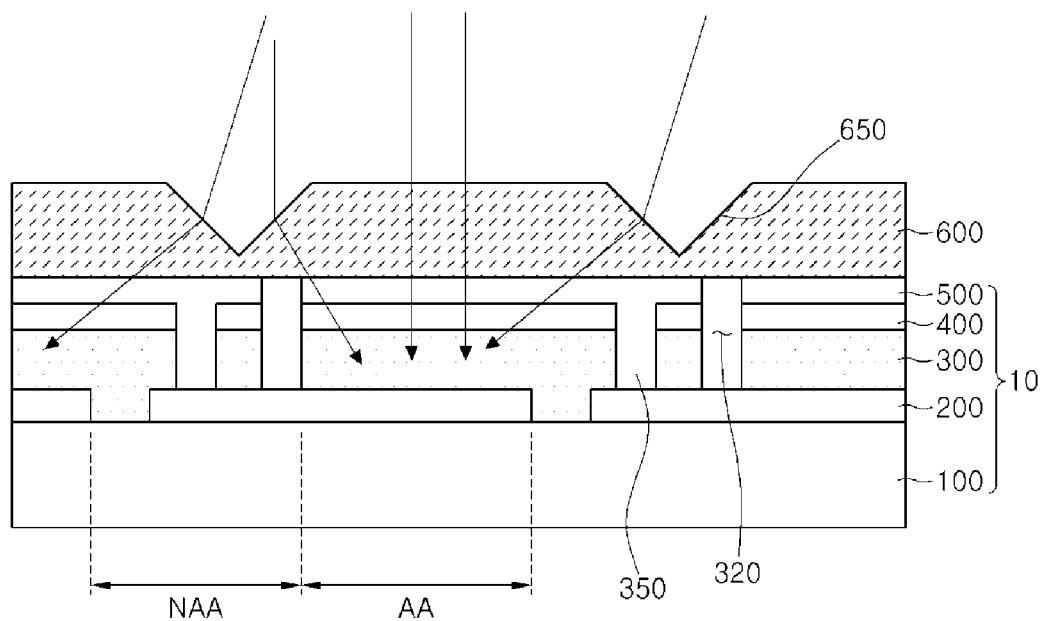

[Figure 9]
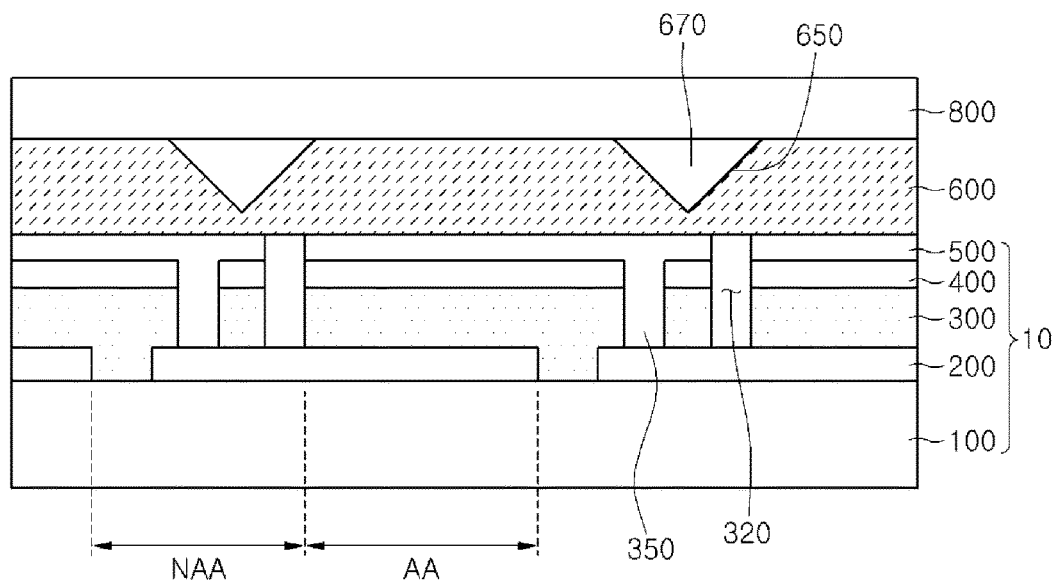
[Figure 10]
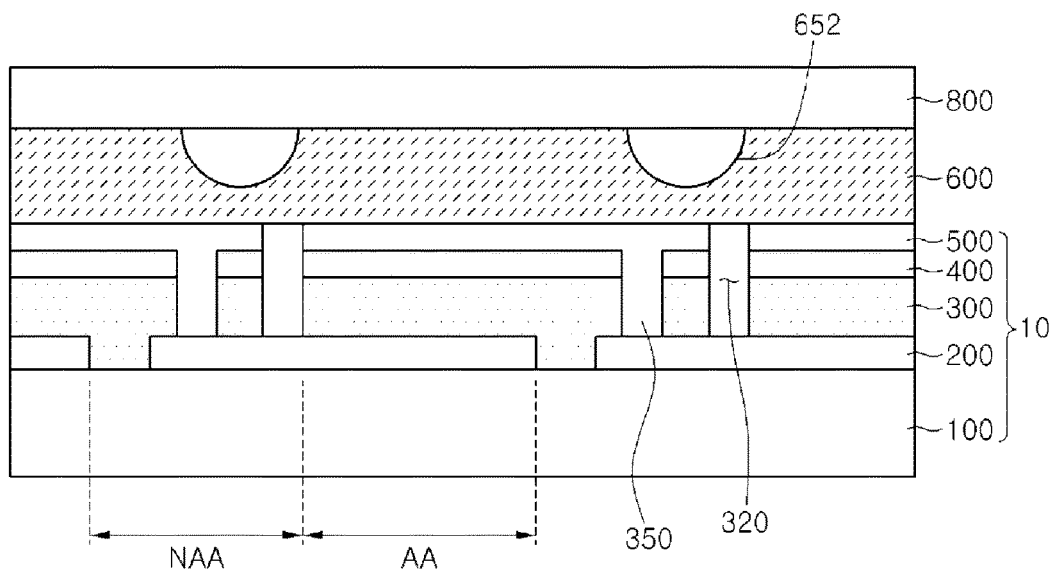

[Figure 11]
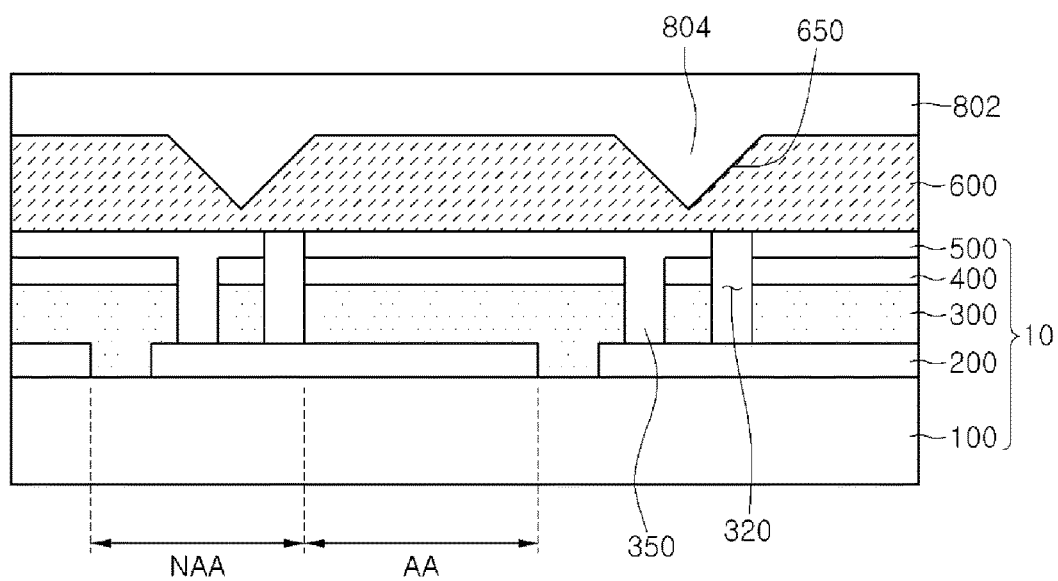

SOLAR BATTERY AND METHOD FOR MANUFACTURING THE SAME

CROSS-REFERENCE TO RELATED APPLICATION

This application is the U.S. national stage application of International Patent Application No. PCT/KR2010/004256, filed Jun. 30, 2010, which claims priority to Korean Application No. 10-2009-0058788, filed Jun. 30, 2009, the disclosures of each of which are incorporated herein by reference in their entirety.

TECHNICAL FIELD

The present disclosure relates to a solar battery and a method for manufacturing the solar cell.

BACKGROUND ART

As the consumption of energy increases, research has been conducted on solar batteries for converting solar energy into electric energy.

Particularly, $Cu(In, Ga)Se_2$ (CIGS) solar batteries are widely used, which are pn hetero junction devices having a substrate structure including a glass substrate, a metal rear electrode layer, a p-type CIGS light absorption layer, a high resistance buffer layer, and an n-type window layer.

Some of light incident on such a CIGS solar battery is incident on a non-active area of the CIGS battery at which the photovoltaic effect does not occur.

If the size of a solar battery module increases, the portion of the non-active area of the module becomes considerable.

Therefore, research has been carried out to improve the light incident efficiency of solar batteries.

DISCLOSURE

Technical Problem

Embodiments provide a solar battery having improved efficiency owing to an increased amount of light incident on a solar cell area, and a method for manufacturing the solar battery.

Technical Solution

In an embodiment, a solar battery includes: a polymer resin layer on a solar cell; and an upper substrate on the polymer resin layer, wherein a pattern is formed in the polymer resin layer.

In another embodiment, there is provided a method for manufacturing a solar battery, the method including: forming a polymer region layer on a solar cell; forming a pattern in the polymer region layer; and placing an upper substrate on the polymer region layer where the pattern is formed.

In another embodiment, there is provided a method for manufacturing a solar battery, the method including: forming a polymer region layer on a solar cell; and forming a pattern including a concave part in the polymer region layer by placing an upper substrate including a protrusion on the polymer region layer.

Advantageous Effects

According to the solar battery and the solar battery manufacturing method of the embodiments, an ethylene vinyl acetate (EVA) film including concave patterns the sidewalls of which are sloped is disposed between the solar cell and the upper substrate, so that the optical path of light incident on the concave patterns can be changed.

Particularly, the optical path of light incident on a non-active area of the solar cell can be changed to an active area of the solar cell, so as to improve the efficiency of the solar battery.

DESCRIPTION OF DRAWINGS

FIGS. 1 to 9 are sectional view for explaining a method for manufacturing a solar battery according to a first embodiment FIG. 10 is a sectional view illustrating a solar battery according to a second embodiment.

FIG. 11 is a sectional view illustrating a solar battery according to a third embodiment.

BEST MODE

In the following description, it will be understood that when a substrate, a layer (or film), or an electrode is referred to as being 'on' another substrate, layer, or electrode, it can be directly on the other substrate, layer or electrode, or one or more intervening substrates, layers, or electrodes may also be present. Further, it will be understood that when a substrate, a layer, or an electrode is referred to as being 'under' another substrate, layer, or electrode, it can be directly under the other substrate, layer, or electrode, or one or more intervening substrates, layers, or electrodes may also be present. In addition, it will also be understood that when a layer is referred to as being 'between' two layers, it can be the only layer between the two layers, or one or more intervening layers may also be present. Further, the reference about 'on' and 'under' each layer will be made on the basis of drawings. Also, in the drawings, the sizes of elements may be exaggerated for clarity of illustration, and the size of each element does not entirely reflect an actual size.

FIGS. 1 to 9 are sectional view for explaining a method for manufacturing a solar battery according to a first embodiment First, as shown in FIG. 1, a rear electrode 201 is formed on a substrate 100.

The substrate 100 may be a glass substrate. Alternatively, the substrate 100 may be a ceramic substrate such as an alumina substrate, a stainless steel substrate, a titanium substrate, or a polymer substrate.

In case of using a glass substrate, a sodalime glass substrate may be used. In case of using a polymer substrate, a polyimide substrate may be used.

In addition, the substrate 100 may be rigid or flexible.

The rear electrode 201 may be formed of a conductive material such as a metal.

For example, the rear electrode 201 may be formed through a sputtering process using molybdenum (Mo) as a target.

In this case, owing to high electric conductivity of molybdenum (Mo), the rear electrode 201 may make ohmic contact with a light absorption layer and be stable at a high temperature under a selenium (Se) atmosphere.

Although not shown in the drawings, the rear electrode 201 may be constituted by at least one layer.

In the case where the rear electrode 201 is constituted by a plurality of layers, the layers may be formed of different materials.

Then, as shown in FIG. 2, the rear electrode 201 is patterned to form a rear electrode pattern 200.

In addition, the rear electrode pattern 200 may have a stripe or matrix shape corresponding to cells.

However, the shape of the rear electrode pattern 200 is not limited to the above-mentioned shapes. The rear electrode pattern 200 may have various shapes.

Next, as shown in FIG. 3, a light absorption layer 300 and a buffer layer 400 are formed on the rear electrode pattern 200.

The light absorption layer 300 may be formed of a group Ib-IIIb-VIb compound.

For example, the light absorption layer 300 may include a $Cu(In, Ga)Se_2$ (GIGS) compound.

Alternatively, the light absorption layer 300 may include a $CuInSe_2$ (CIS) compound or $CuGaSe_2$ (CGS) compound.

For example, a CIG metal precursor layer is formed on the rear electrode pattern 200 by using a copper target, an indium target, and a gallium target so as to form the light absorption layer 300.

Then, the metal precursor layer reacts with selenium (Se) in a selenization process to form a CIGS light absorption layer 300.

In addition, during the metal precursor forming process and the selenization process, an alkali component included in the substrate 100 diffuses to the metal precursor layer and the light absorption layer 300 through the rear electrode pattern 200.

The alkali component may increase grain sizes of the light absorption layer 300 and improve crystalline properties of the light absorption layer 300.

Alternatively, the light absorption layer 300 may be formed by a co-evaporation method using copper (Cu), indium (In), gallium (Ga), and selenium (Se).

The light absorption layer 300 receives light and converts the light into electrical energy. The light absorption layer 300 generates a photoelectromotive force by the photovoltaic effect.

The buffer layer 400 may be constituted by at least on layer. For example, the buffer layer 400 may be formed by stacking one or more of CdS, ITO, ZnO, and i-ZnO on the substrate 100 where the rear electrode pattern 200 is formed.

The buffer layer 400 may be formed as a transparent electrode.

At this time, the buffer layer 400 is an n-type semiconductor layer, and the light absorption layer 300 is a p-type semiconductor layer. Therefore, the light absorption layer 300 and the buffer layer 400 form a pn junction.

That is, since the light absorption layer 300 and a second electrode are largely different in lattice constant and energy band gap, the buffer layer 400 having a medium band gap is interposed for a good junction.

In the current embodiment, only one buffer layer is formed on the light absorption layer 300. However, the current embodiment is not limited thereto. For example, two or more buffer layers may be formed.

Next, as shown in FIG. 4, a contact pattern 310 is formed through the light absorption layer 300 and the buffer layer 400.

The contact pattern 310 may be formed by using a mechanical method or irradiating a laser beam, and the rear electrode pattern 200 is partially exposed through the contact pattern 310.

Next, as shown in FIG. 5, a front electrode 500 which is a second electrode, and interconnections 350 are formed by disposing a transparent conductive material on the buffer layer 400.

When the transparent conductive material is disposed on the buffer layer 400, the transparent conductive material is inserted in the contact pattern 310 to form the interconnections 350.

The rear electrode pattern 200 and the front electrode 500 are electrically connected through the interconnections 350.

The front electrode 500 is formed on the substrate 100 through a sputtering process using a zinc oxide doped with aluminium.

The front electrode 500 is a window layer forming a pn junction with the light absorption layer 300. Since the front electrode 500 functions as a front transparent electrode of a solar battery, the front electrode 500 is formed of a zinc oxide (ZnO) having high optical transmittance and electric conductivity.

At this time, an electrode having a low resistance can be formed by doping a zinc oxide with aluminium.

A zinc oxide thin film may be formed as the front electrode 500 by a radio frequency (RF) sputtering method using a ZnO target, a reactive sputtering method using a Zn target, or an organic metal chemical deposition method.

In addition, the front electrode 500 may have a dual structure formed by depositing an indium thin oxide (ITO) thin film having good electro-optical characteristics on the zinc oxide thin film.

Next, as shown in FIG. 6, a separation pattern 320 is formed through the light absorption layer 300 and the buffer layer 400.

The separation pattern 320 may be formed by using a mechanical method or irradiating a laser beam, and the rear electrode pattern 200 may be partially exposed through the separation pattern 320.

The buffer layer 400 and the front electrode 500 may be separated by the separation pattern 320, for example, to form cells.

The buffer layer 400 and the light absorption layer 300 may be formed into a stripe or matrix shape by the separation pattern 320.

However, the shape of the separation pattern 320 is not limited to the above-mentioned shapes. The separation pattern 320 may have various shapes.

At this time, the width of the separation pattern 320 may be increased to widen the width of a transparent opening of the solar battery.

The separation pattern 320 forms cells each including the rear electrode pattern 200, the light absorption layer 300, the buffer layer, and the front electrode 500.

At this time, the cells may be connected to each other by the interconnections 350. For example, the rear electrode pattern 200 of a second cell may be connected to the front electrode 500 of a first cell neighboring the second cell through the interconnection 350.

The separation pattern 320 defines solar cells 10 each including the substrate 100, the rear electrode pattern 200, the light absorption layer 300, the buffer layer 400, and the front electrode 500.

Next, as shown in FIG. 7, a transparent polymer resin layer such as an ethylene vinyl acetate (EVA) film 600 is disposed on the front electrode 500, and concave patterns (concave parts) 650 are formed in the EVA film 600.

The concave patterns 650 may be formed by pressing a mold 700 against the EVA film 600.

However, the concave pattern 650 may be formed by other methods such as a method of using a hot press.

The mold 700 includes a support part 710 and a plurality of protrusions 720 extending from the support part 710.

The protrusions 720 may have a triangular section, which is wider at a part adjoining the support part 710 and narrower at a part distant from the support part 710.

If the EVA film 600 is pressed by using the protrusions 720, the concave patterns 650 having a shape corresponding to the shape of the protrusions 720 are formed in the EVA film 600.

The concave patterns 650 may be formed in non-active areas (NAA) of the solar cells 10 which are not valid for energy conversion.

Like the protrusions 720, the concave patterns 650 have a triangular shape which is wider at the top side and narrower at the bottom side, and thus, sidewalls of the concave patterns 650 are sloped. That is, the concave patterns 650 may have a V-notch shape.

Since the sidewalls of the concave patterns 650 are sloped, the optical path of light incident on the concave patterns 650 may be changed.

FIG. 8 illustrates light incident on the solar cells 10. Since the sidewalls of the concave patterns 650 are sloped, light incident on the NAAs of the solar cells 10 is directed to active areas (AAs) of the solar cells 10.

That is, by changing the optical path of light incident on the NAAs of the solar cells 10 to the AAs of the solar cells 10, the efficiency of the solar battery can be improved.

Then, as shown in FIG. 9, an upper substrate 800 is disposed on the EVA film 600 where the concave patterns 650 are formed.

The upper substrate 800 may be formed of low iron reinforced glass or heat strengthened glass.

Owing to the concave patterns 650 of the EVA film 600, air gaps 670 are formed between the EVA film 600 and the upper substrate 800.

With reference to FIG. 9, a detailed explanation will be given on the solar battery formed by the above-described solar battery manufacturing method.

The solar battery of the above-described embodiment includes the EVA film 600 on the solar cells 10 and the upper substrate 800 on the EVA film 600.

The EVA film 600 which is a polymer resin layer includes the concave patterns 650, and the sidewalls of the concave patters 650 are sloped.

The upper parts of the concave patterns 650 are wider than the lower parts of the concave patterns 650, and air gaps 670 are formed between the EVA film 600 and the upper substrate 800 owing to the concave patterns 650.

According to the solar battery and the solar battery manufacturing method of the embodiment, the EVA film 600 including the sloped concave patterns 650 is disposed between the solar cells 10 and the upper substrate 800 so that the optical path of light incident on the concave patterns 650 can be changed.

Particularly, by changing the optical path of light incident on the NAAs of the solar cells 10 to the AAs of the solar cells 10, the efficiency of the solar battery can be improved.

A solar battery and a method for manufacturing the solar battery will be described according to second and third embodiments. Descriptions of the same or similar structures as those described in the first embodiment will not be given but descriptions will be given only on different structures.

FIG. 10 is a sectional view illustrating a solar battery according to a second embodiment.

In the current embodiment, concave patterns (concave parts) 652 have a curved sectional shape. For example, the concave patterns 652 may have a curved shape such as a semicircular or semielliptical shape. The concave patterns 652 may have other shapes. The concave patterns 652 form air gaps.

The concave patterns 652 may be formed in the same or similar method as that in the first embodiment, and thus a description thereof will be omitted.

FIG. 11 is a sectional view illustrating a solar battery according to a third embodiment.

Referring to FIG. 11, in the current embodiment, protrusions 804 corresponding to concave patterns 650 are formed on an upper substrate 802, and the protrusions 804 are inserted in the concave patterns 650. Owing to this structure, the concave patterns 650 can be kept at the same state although a pressure is applied to the concave patterns 650, and thus the optical path of light incident on the concave patterns 650 can be changed with less influence of outer environments, so as to improve the optical efficiency of the solar battery.

In this case, the concave patterns 650 may be formed by using a mold having protrusions as shown in FIG. 7 or a hot press, and then the upper substrate 802 may be positioned by inserting the protrusions 804 into the concave patterns 650.

Alternatively, after a polymer resin layer 600 is formed on solar cells 10, the upper substrate 802 having the protrusions 804 may be placed on the polymer resin layer 600 to form concave patterns 650 in the polymer resin layer 600. In this case, since the concave patterns 650 are formed when the upper substrate 802 is placed, an additional process is not necessary for forming the concave patterns 650. That is, processes can be simplified.

At this time, the concave patterns 650 can be placed in NAAs of the solar cells 10 by placing the protrusions 804 in the NAAs of the solar cells 10.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar battery comprising:
   a solar cell comprising a rear electrode pattern, a light absorption layer, a buffer layer, and a front electrode layer;
   a polymer resin layer disposed on the front electrode layer; and
   an upper substrate disposed on the polymer resin layer;
   wherein an upper surface of the polymer resin layer comprises a concave pattern and a flat surface portion formed therein and a lower surface of the polymer resin layer has a flat surface, and the flat surface of the lower surface of the polymer resin layer is in contact with an upper surface of the front electrode layer;
   wherein the flat surface portion is disposed over an active area of the solar cell and beside the concave pattern, and the concave pattern is disposed over a non-active area of the solar cell;
   wherein the polymer resin layer is disposed on the solar cell with the concave pattern facing away from the solar cell such that an upper part of the concave pattern is wider than a lower part of the concave pattern;

wherein the upper part of the concave pattern is farther away from the solar cell, in a longitudinal direction perpendicular to the upper surface of the solar cell, than is the lower part of the concave pattern;

wherein the upper substrate comprises a protrusion that is inserted into the concave pattern;

wherein the solar cell comprises a contact pattern formed through the light absorption layer and the buffer layer and a separation pattern separating regions of the buffer layer and separating regions of the front electrode layer;

wherein the separation pattern is formed as a transparent opening and an inner part of the separation pattern is empty;

wherein the rear electrode pattern is partially exposed through the contact pattern; and wherein a material of the front electrode layer inserted in the contact pattern forms an interconnection for connecting the rear electrode pattern and the front electrode layer.

2. The solar battery according to claim 1, wherein a sidewall of the concave pattern is sloped.

3. The solar battery according to claim 1, wherein the concave pattern has a notch-shaped or curved section, and
wherein the protrusion has a shape corresponding to the notch-shaped or curved section of the concave pattern.

4. The solar battery according to claim 1, wherein an entire width of the concave pattern is disposed directly over the non-active area of the solar cell in the longitudinal direction.

5. The solar battery according to claim 1, wherein the polymer resin layer comprises ethyl vinyl acetate (EVA).

6. A method for manufacturing a solar battery, comprising:
forming a solar cell comprising a rear electrode pattern, a light absorption layer, a buffer layer, and a front electrode layer;
forming a polymer resin layer on the front electrode layer;
forming a pattern and a flat surface portion on an upper surface of the polymer resin layer, wherein the pattern comprises a concave pattern and a lower surface of the polymer resin layer has a flat surface, and the flat surface of the lower surface of the polymer resin layer is in contact with an upper surface of the front electrode layer; and placing an upper substrate on the polymer resin layer where the pattern is formed;

wherein the flat surface portion is disposed over an active area of the solar cell and beside the pattern, and the concave pattern is disposed over a non-active area of the solar cell;

wherein the concave pattern faces away from the solar cell such that an upper part of the concave pattern is wider than a lower part of the concave pattern;

wherein the upper part of the concave pattern is farther away from the solar cell, in a longitudinal direction perpendicular to the upper surface of the solar cell, than is the lower part of the concave pattern;

wherein the upper substrate comprises a protrusion that is inserted into the concave pattern;

wherein the solar cell comprises a contact pattern formed through the light absorption layer and the buffer layer and a separation pattern separating regions of the buffer layer and separating regions of the front electrode layer;

wherein the separation pattern is formed as a transparent opening and an inner part of the separation pattern is empty;

wherein the rear electrode pattern is partially exposed through the contact pattern; and wherein a material of the front electrode layer inserted in the contact pattern forms an interconnection for connecting the rear electrode pattern and the front electrode layer.

7. The method according to claim 6, wherein an entire width of the concave part is disposed directly over the non-active area of the solar cell in the longitudinal direction.

8. The method according to claim 6, wherein the polymer resin layer is disposed between the solar cell and the upper substrate, and wherein the placing of the upper substrate is performed by disposing the protrusion of the upper substrate in the concave part.

* * * * *